(12) United States Patent
Menchtchikov et al.

(10) Patent No.: US 9,069,240 B2
(45) Date of Patent: Jun. 30, 2015

(54) CALIBRATION OF LITHOGRAPHIC APPARATUS BY EXPOSING PATTERNS ON SUBSTRATE POSITIONED AT DIFFERENT ORIENTATIONS

(75) Inventors: Boris Menchtchikov, Eindhoven (NL); Alexander Viktorovych Padiy, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 847 days.

(21) Appl. No.: 13/017,640

(22) Filed: Jan. 31, 2011

(65) Prior Publication Data
US 2011/0205515 A1    Aug. 25, 2011

Related U.S. Application Data

(60) Provisional application No. 61/306,096, filed on Feb. 19, 2010.

(51) Int. Cl.
*G03B 27/32* (2006.01)
*G03B 27/53* (2006.01)
*G03F 7/20* (2006.01)

(52) U.S. Cl.
CPC ............ *G03B 27/53* (2013.01); *G03F 7/70516* (2013.01)

(58) Field of Classification Search
CPC .................................................. G03F 7/70516
USPC .......................................................... 355/77
See application file for complete search history.

(56) References Cited

U.S. PATENT DOCUMENTS

2006/0023194 A1* 2/2006 Loopstra et al. ................ 355/72

FOREIGN PATENT DOCUMENTS

EP         1 628 164 A2    2/2006

* cited by examiner

*Primary Examiner* — Chia-how Michael Liu
(74) *Attorney, Agent, or Firm* — Sterne, Kessler, Goldstein & Fox P.L.L.C.

(57) ABSTRACT

A system and method for calibrating system parameters of a lithography apparatus is disclosed. The system includes a measurement device configured to measure an overlay error between patterns formed on a substrate during different exposures and a processing device configured to determine a model representative of a relationship between the overlay error and a system parameter error based on the measured overlay error. The method includes measuring an overlay error between patterns formed at different exposures with the substrate positioned at different orientations during each of the different exposures. The method further includes determining a model representative of a relationship between the overlay error and a system parameter error based on the measured overlay error and deriving a calibration correction factor from the model.

9 Claims, 7 Drawing Sheets

CALIBRATION OF LITHOGRAPHIC APPARATUS BY EXPOSING PATTERNS ON SUBSTRATE POSITIONED AT DIFFERENT ORIENTATIONS

CROSS REFERENCE TO RELATED APPLICATIONS

This application claims benefit under 35 U.S.C. 119(e) to U.S. Provisional Patent Application 61/306,096, filed Feb. 19, 2010, which is incorporated by reference herein in its entirety.

BACKGROUND

1. Field of the Invention

The present invention relates to methods of calibration of a lithographic apparatus.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is necessary to measure parameters of the patterned substrate, for example the overlay error between successive layers formed in or on it and critical line width in a developed metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

When a lithography system is first installed it must be calibrated to ensure optimal operation. However over time, system performance parameters will drift. The key system performance parameters that are subject to drift are the overlay and focus stability of the lithographic apparatus.

A small amount of drift can be tolerated, but too much drift means that the system will go out of specification. This problem increases with smaller chip features. As chip features get smaller, so do the tolerances, or the process window, that manufacturers must work within. The smaller the process window the harder it is to manufacture chips that work properly.

Therefore, wafer manufacturers who use lithography apparatus need to periodically stop production for recalibration of the lithography apparatus. Calibrating the system more frequently can yield a larger process window, but means more scheduled down time.

In order to reduce the frequency at which production must be stopped to perform calibrations, additional calibrations can be performed on the basis of standard measurements retrieved from a monitor or a reference wafer. The monitor wafer can be exposed using a specialized reticle containing special scatterometry marks. From the measurements, it can be determined how far the system performance parameters have drifted from their ideal performance levels and wafer level overlay and focus correction sets can be calculated. These correction sets can then be converted into specific corrections for each exposure on subsequent production wafers.

This off-tool method using monitor wafers can be performed on a more regular basis than the full scale calibrations, for example on a daily basis or every other day, without having to stop production. These more regular corrections enable compliance with a narrower process window and improvement in system parameter stability.

Further efficiencies can be realized by using a golden scanner grid, e.g., a map of overlay errors, as the baseline for measuring overlay stability, instead of using random monitoring wafers, meaning that overlay grid matching and long term stability can be achieved in one automated step.

However, even given the benefits of making these types of corrections, there are associated problems. The reference wafers are re-used and thus are subject to aging. An etched grid can be reused for only twenty to thirty reworks before the monitor wafers need to be replaced, which can have a negative impact on the work in progress. The initial grid quality governs the accuracy of the correction process and deteriorates with the age of the monitor wafers.

SUMMARY

Therefore, what is needed is an effective system and method of correcting for errors in system parameters of lithographic apparatus that can increase the accuracy of calibration of the lithographic apparatus.

In an embodiment of the present invention, there is provided a method of detecting errors in system parameters of a lithographic apparatus that includes performing a number of exposures to form markers on a substrate, with the substrate positioned at a different orientation for each exposure and then measuring the overlay between corresponding markers formed from the different exposures.

In a further embodiment of the present invention, there is provided a method of calibrating a lithographic apparatus that includes detecting errors in system parameters of a lithographic apparatus by performing a number of exposures to form markers on a substrate with the substrate being positioned at a different orientation for each exposure and then measuring the overlay between corresponding markers formed from the different exposures thereby obtaining system parameter errors from the measured overlay. The method also provides for deriving calibration correction factors from the obtained system parameter errors.

In a still further embodiment of the present invention, there is provided a lithographic apparatus that includes an illuminator arranged to perform a number of exposures to form markers on a substrate with the substrate being positioned at a different orientation for each exposure and a measurement device arranged to measure the overlay between corresponding markers formed from the different exposures.

In a still further embodiment of the present invention, there is provided a lithographic apparatus that includes an illuminator arranged to perform a number of exposures to form markers on a substrate with the substrate being positioned at a different orientation for each exposure, and a measuring device arranged to measure the overlay between corresponding markers formed from different exposures with a computer arranged to obtain system parameter errors from the measured overlay and to derive calibration correction factors from the obtained system parameter errors.

Further embodiments, features, and advantages of the present invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

Embodiments of the invention will now be described, by way of example only, with reference to the accompanying schematic drawings in which corresponding reference symbols indicate corresponding parts. Further, the accompanying drawings, which are incorporated herein and form part of the specification, illustrate the present invention, and, together with the description, further serve to explain the principles of the invention and to enable a person skilled in the relevant art(s) to make and use the invention.

Figure 1:
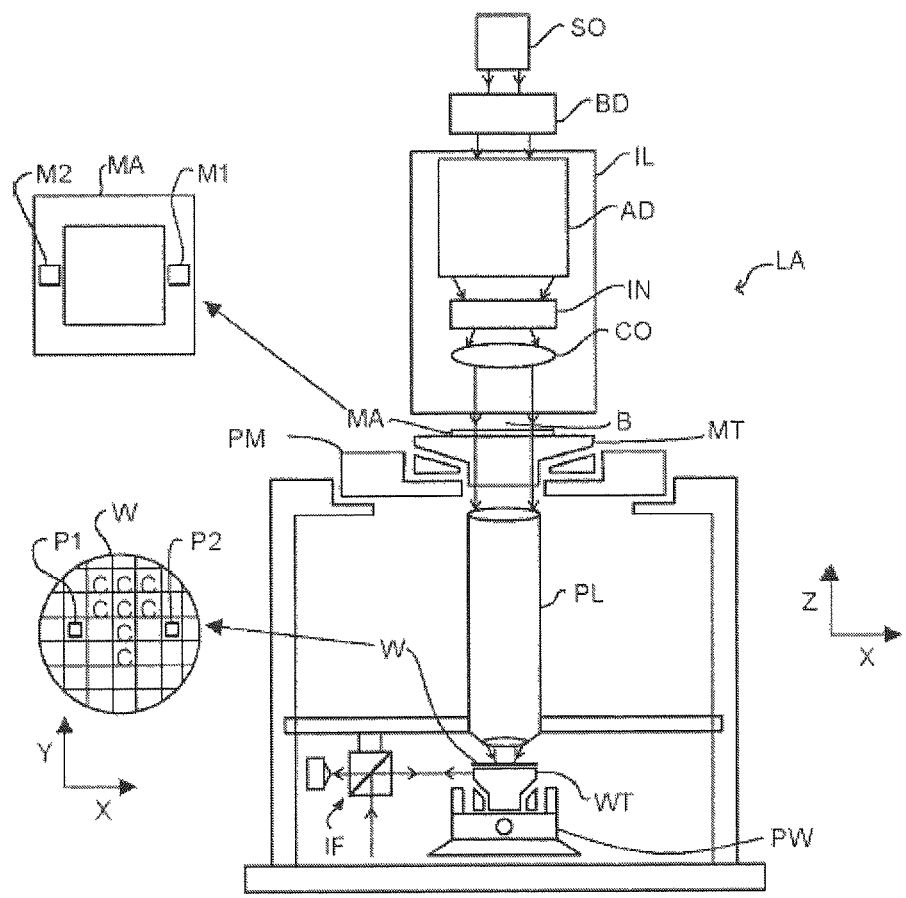
FIG. 1 depicts a lithographic apparatus, according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus, according to an embodiment of the present invention. The apparatus includes an illumination system (illuminator) IL configured to condition a radiation beam B (e.g., UV radiation or DUV radiation); a support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic, or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic, or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing various types of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

In this embodiment, for example, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two, e.g., dual stage, or more substrate tables and, for example, two or more mask tables. In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent, which are commonly referred to as σ-outer and σ-inner, respectively, of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2, and substrate alignment marks P1, P2. Although the substrate alignment marks as illustrated occupy dedicated target portions, they may be located in spaces between target portions, which are known as scribe-lane alignment marks. Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
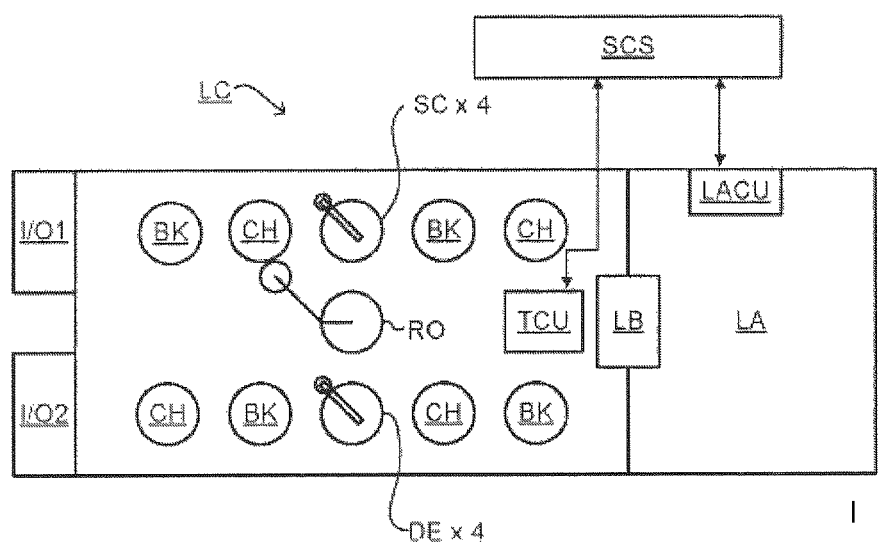
FIG. 2 depicts a lithographic cell or cluster, according to an embodiment of the present invention.

As shown in FIG. 2, according to an embodiment of the present invention, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU that is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments, for example, may be made to exposures of subsequent substrates, especially if the inspection can be done soon and fast enough that other substrates of the same batch are still to be exposed. Also, already exposed substrates may be stripped and reworked to improve yield or to possibly be discarded, thereby avoiding performing exposures on substrates that are known to be faulty. In a case where only some target portions of a substrate are faulty, further exposures can be performed only on those target portions that are deemed to be non-faulty.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast, as in there is only a very small difference in refractive index between the parts of the resist that have been exposed to radiation and those that have not, and not all inspection apparatus have sufficient sensitivity to make useful measurements of the latent image. Therefore measurements may be taken after the post-exposure bake step (PEB) that is customarily the first step carried out on exposed substrates and increases the contrast between exposed and unexposed parts of the resist. At this stage, the image in the resist may be referred to as semi-latent. It is also possible to make measurements of the developed resist image at which point either the exposed or unexposed parts of the resist have been removed or after a pattern transfer step such as etching. The latter possibility limits the possibilities for rework of faulty substrates but may still provide useful information.

Figure 3:
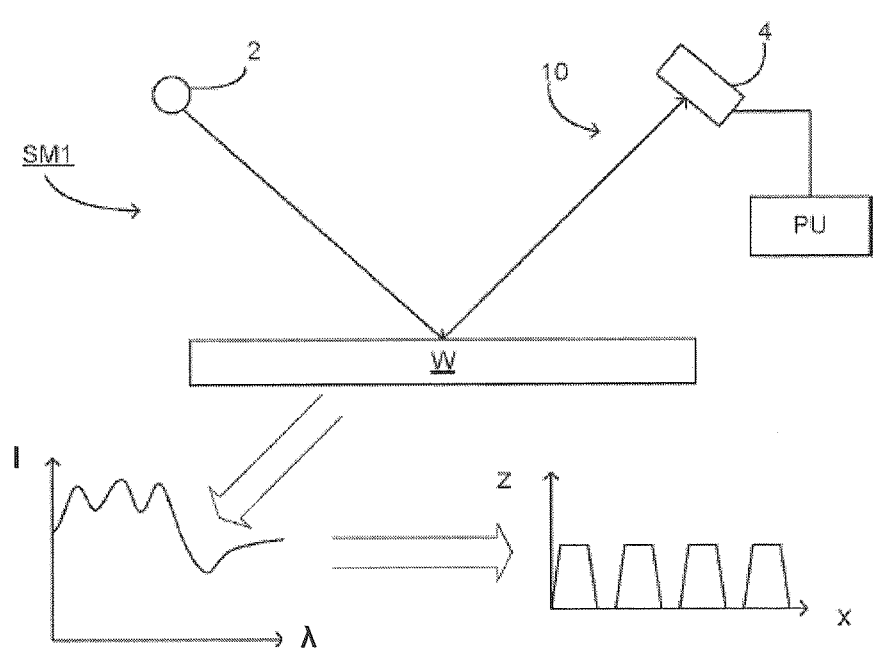
FIG. 3 depicts a first scatterometer, according to an embodiment of the present invention.

FIG. 3, according to an embodiment of the present invention, depicts a scatterometer SM1 that may be used in the present invention. It comprises a broadband (white light) radiation projector 2 that projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
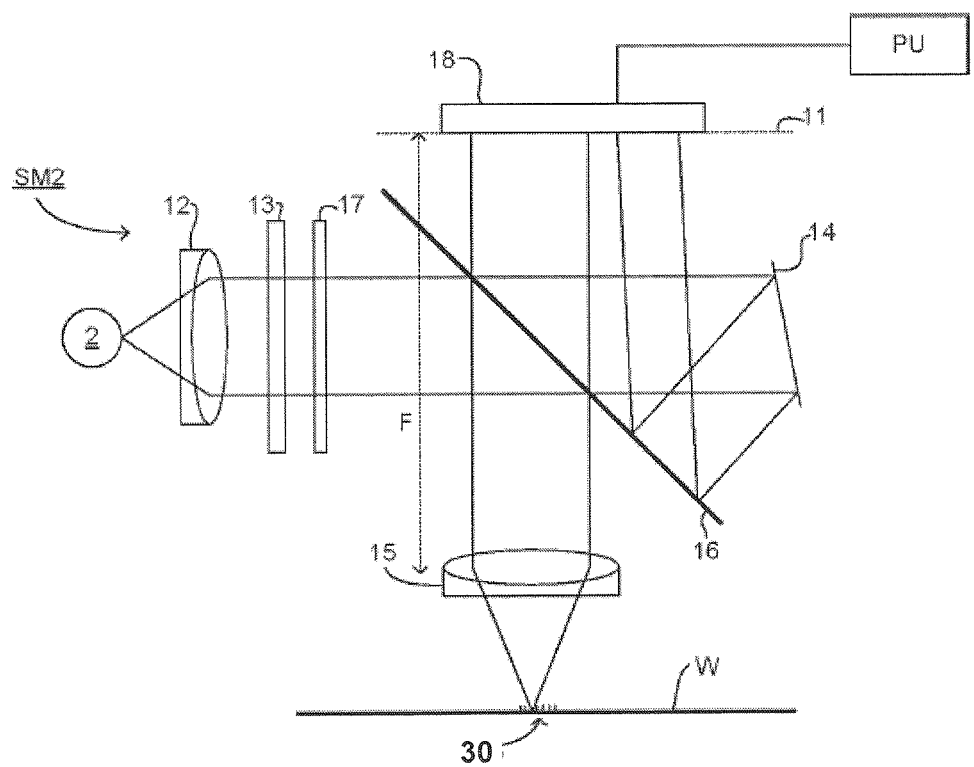
FIG. 4 depicts a second scatterometer, according to an embodiment of the present invention.

Another scatterometer SM2 that may be used with the present invention is shown in FIG. 4, according to an embodiment of the present invention. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), for example, preferably at least about 0.9, and more preferably at least about 0.95. Immersion scatterometers may even have lenses with numerical apertures over 1. The reflected radiation then transmits through partially reflecting surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. In one example, the detector is a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18 or alternatively on to a different detector (not shown).

A set of interference filters 13 is available to select a wavelength of interest in the range of, for example, 405-790 nm, or even lower, such as 200-300 nm. The interference filter may be tunable rather than comprising a set of different filters. A grating could be used instead of interference filters.

The detector 18 can measure the intensity of scattered light at a single wavelength, or in a narrow wavelength range, the intensity separately at multiple wavelengths or integrated over a wavelength range. Furthermore, the detector can separately measure the intensity of transverse magnetic and transverse electric polarized light and/or the phase difference between the transverse magnetic and transverse electric polarized light.

Using a broadband light source (i.e., one with a wide range of light frequencies or wavelengths, and therefore a wide range of colors is possible, which gives a large Etendue, allowing the mixing of multiple wavelengths. The plurality of wavelengths in the broadband preferably each has a bandwidth of $\Delta\lambda$ and a spacing of at least 2 $\Delta\lambda$ (i.e., twice the bandwidth). A plurality of "sources" of radiation can be different portions of an extended radiation source that have been split using fiber bundles. In this way, angle resolved scatter spectra can be measured at multiple wavelengths in parallel. A 3-D spectrum, for example, such as wavelength and two different angles, can be measured, which contains more information than a 2-D spectrum. This allows more information to be measured that increases metrology process robustness. This is described in more detail in European Patent No. 1,628,164A, which is incorporated by reference herein in its entirety.

The target 30 on substrate W may be a 1-D grating, which is printed such that after development, the bars are formed of solid resist lines. The target 30 can be a 2-D grating, which is printed such that after development, the grating is formed of solid resist pillars or vias in the resist. The bars, pillars, or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, can be input to the reconstruction process, performed by processing unit PU, from knowledge of the printing step and/or other scatterometry processes.

Figure 5:
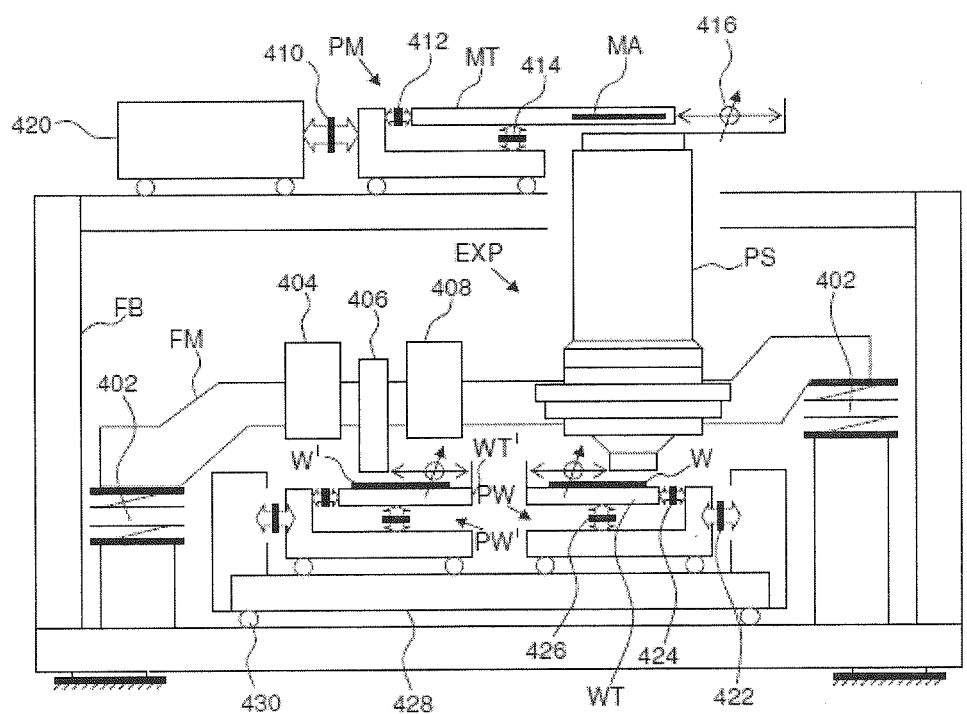
FIG. 5 is a schematic diagram showing components of a lithographic apparatus having separate measurement and exposure stages, according to an embodiment of the present invention.

FIG. 5, according to an embodiment of the present invention, shows schematically the arrangement of one embodiment of the apparatus of FIG. 1, in which the apparatus is of the type having dual substrate supports and separate metrology and exposure stations.

A base frame FB supports and surrounds the apparatus on the ground. Within the apparatus, and serving as an accurate positional reference, a metrology frame FM is supported on air bearings 402, which isolate it from vibrations in the environment. Mounted on this frame are the projection system PS, which naturally forms the core of the exposure station EXP, and also instruments 404, 406, 408, which are the functional elements of the metrology station MET. Above these stations, the mask table MT and mask MA are mounted above the projection system PS. The first positioner PM comprises long-throw (coarse) actuators 410 and short-throw (fine) actuators 412, 414. These operate by active feedback control to obtain the desired position of mask MA with respect to the projection system PS, and hence with respect to metrology frame FM. This measurement is indicated schematically at 416. The whole positioning mechanism for the mask MA is supported on the base frame at B via active air bearings 418 etc. A balance mass 420 is provided to mimic at least coarse movements of the mask table MT and positioning, to reduce vibrations being transmitted into the frame and other components. A low frequency servo control keeps balance mass 420 in a desired average position. Wafer table WT shown beneath the projection system similarly has coarse actuators 422 and fine actuators 424, 426 for positioning substrate W accurately with respect to the exit lens of the projection system PS. Additionally, according to the dual-stage arrangement of this example, a duplicate wafer table WT' and positioning mechanism PW' are provided. As illustrated, these duplicate elements are supporting a second substrate W' at the metrology station MET. Wafer tables WT, WT' and their respective positioners PW and PW' are carried on and connected to a shared balance mass 428. Again, air bearings, or other suitable bearings such as magnetic, electrostatic, and so forth, are shown schematically, for example at 430. Measurements of wafer table position used for the coarse and fine control of the positions of the wafers W and W' are made relative to elements 406 at the metrology station and PS at the exposure station, both of these ultimately referring back to metrology frame FM.

Figure 6:
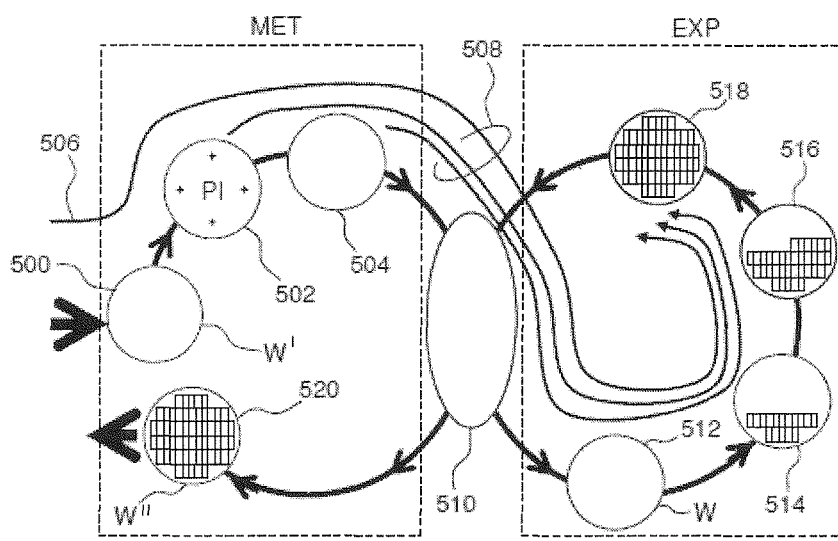
FIG. 6 illustrates schematically the stages in the measurement and exposure processes in the apparatus of FIG. 5, according to an embodiment of the present invention.

FIG. 6, according to an embodiment of the present invention, illustrates the steps in this twin-stage apparatus of FIG. 5 to expose dies on a substrate W. On the left hand side within a dotted box are steps performed at metrology station MET, while the right hand side shows steps performed at the exposure station EXP. A substrate W has already been loaded into the exposure station. A new substrate W' is loaded to the apparatus by a mechanism not shown at step 500. These two substrates are processed in parallel in order to increase the throughput of the metrology process as a whole. Referring initially to the newly-loaded substrate W', this may be a previously unprocessed substrate, prepared with a new photo resist for first time exposure in the apparatus. In general, however, the lithography process described will be merely one step in a serious of exposure and processing steps, so that substrate W' has been through this apparatus and/or other lithography apparatus several times already, and may have subsequent processes to undergo as well. At 502, alignment measurements using the substrate marks P1 etc. and image sensors etc. are used to measure and record alignment of the substrate relative to substrate table WT. In practice, several marks across the substrate W' will be measured, to establish the "wafer grid," that maps very accurately the distribution of marks across the substrate, including any distortion relative to a nominal regular grid. At step 504, a map of wafer height against X-Y position is measured also, for use in accurate focusing of the exposed pattern.

When substrate W' was loaded, recipe data 506 are received, defining the exposures to be performed, and also properties of the wafer and the patterns previously made and to be made upon it. To these recipe data are added the measurements made at 502, 504, so that a complete set of recipe and metrology data 508 can be passed to the exposure stage. At 510, wafers W' and W are swapped, so that the measured substrate W' becomes the substrate W entering the exposure apparatus. This swapping is performed by exchanging the supports WT and WT' within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WT (formerly WT') is all that is necessary to make use of the measurement information 502, 504 for the substrate W (formerly W') in control of the exposure steps. At step 512, reticle alignment is performed using mask alignment marks. In steps 514, 516, 518, scanning motions and radiation pulses are applied at successive die locations across substrate W, in order to complete the exposure of a number of patterns. Thanks to the alignment and level map data, these patterns are accurately aligned with respect to desired locations, and, in particular, with respect to features previously laid down on the same substrate. The exposed substrate, now labeled W" is unloaded from the apparatus at step 520, to undergo etching or other processes, in accordance with the exposed pattern.

By employing the separate substrate tables, the performance of the apparatus in terms of substrate throughput through the exposure stages is maintained, while permitting a relatively time-consuming set of measurements to be performed to characterize the wafer and patterns previously deposited upon it.

As mentioned above, the wafer table WT shown in FIG. 1 and wafer tables WT, WT' shown in FIG. 5 have coarse actuators 422 and fine actuators 424, 426 for positioning substrate W accurately with respect to the exit lens of the projection system PS.

Figure 7:
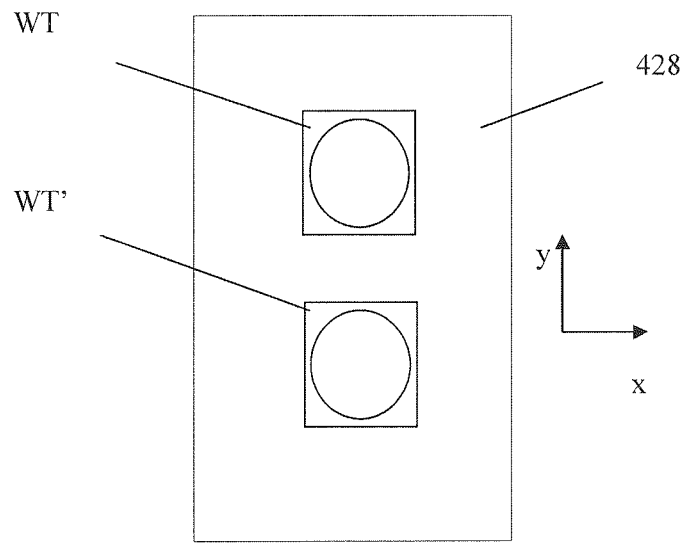
FIG. 7 depicts a first example of an arrangement for moving wafer stages on a substrate, according to an embodiment of the present invention.

There are different known mechanisms for moving the wafer table and mask tables and for measuring their positions. One such system is schematically illustrated in FIG. 7 and uses a planar motor to drive the two wafer tables WT and WT'. The balance mass 428 in this embodiment comprises a magnet plate, and the undersides of the wafer tables WT and WT' comprise force actuators for movement of the tables in the x, y and z directions (the z direction being out of the plane of the page). In the system of the type illustrated in FIG. 7, the position of the tables WT and WT' is measured via encoders that are located on the underside of a metrology frame (shown as FM in FIG. 5), and an image sensor is provided on the relevant wafer chuck to monitor the position via the encoders of the tables. The encoders cooperate to output a location of the wafer tables in (x,y) coordinates.

Figure 8:
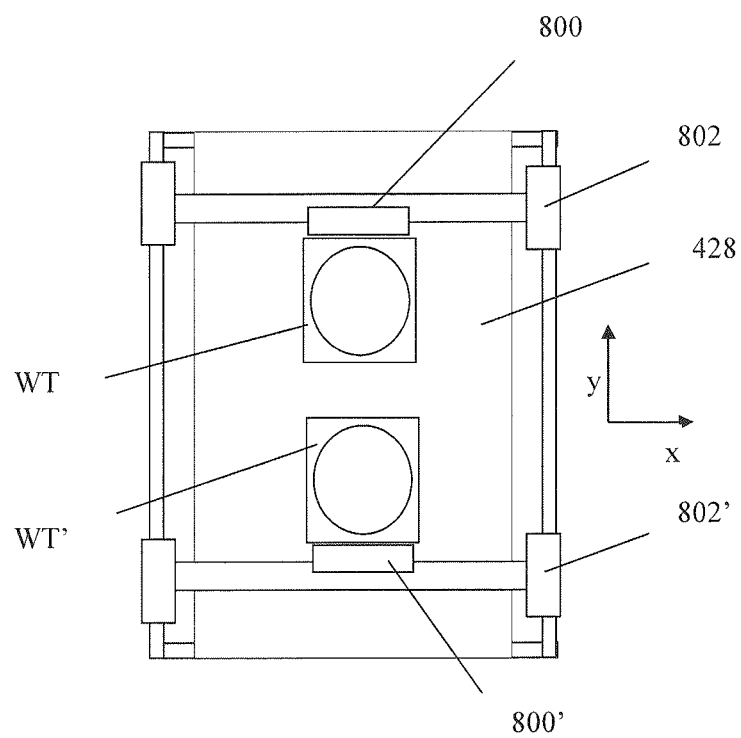
FIG. 8 depicts a second example of an arrangement for moving wafer stages on a substrate, according to an embodiment of the present invention.

An alternative embodiment is shown in FIG. 8, according to an embodiment of the present invention. Here the positions of the wafer tables WT, WT' on the balance mass 428 are controlled via actuators 800, 800' for moving the tables in an x direction, e.g., left and right as shown in the figure, and actuators 802, 802' for moving the tables in a y direction, e.g., up and down as shown in the figure. The positions of the tables WT, WT' are measured by interferometers that project beams onto mirrored side wall surfaces of the wafer tables. Typically an "x" interferometer provides the location of one wafer table in an x axis, and a "y" interferometer provides the location of one wafer table in a y-axis. Each of the "x" and "y" interferometers may comprise transmitters at both sides of the balance mass 428, arranged to direct interferometer beams towards opposing sides of the wafer tables.

The present disclosure relates to embodiments in which system parameters are checked through self-assessment of a production substrate, that is, without the need for a reference or a monitor wafer. In particular, errors derived from mirror or substrate deformation, as well as encoder errors, can be corrected.

The calibration method of the disclosure can be carried out on a regular basis, one or more times between calibration of machine constants; or one or more times between measurement of offsets with monitor wafers; or one or more times between measurement of lot offsets. The choice of when and how often the calibration method of this disclosure is applied depends on the characteristics of the particular process involved, and the desired trade off between calibration accuracy and throughput. However, as the use of a monitor wafer is not required, the application of the method of the present disclosure can be carried out without a severe deleterious effect on throughput, as will become apparent from the description to follow.

Aspects of this disclosure can be embodied in control software that resides in a lithographic apparatus, or alternatively, the aspects can be embodied in a stand-alone calibration device that can perform measurements on a wafer that has been exposed.

In a multiple stage lithographic apparatus, the exposure steps can be carried out at an exposure station, and the measurement steps can be carried out at a metrology station.

The required data storage and calculations can be carried out by a computer that usually is integrated with the lithographic apparatus but could be provided as a separate device. The computer is also arranged to generate control signals that can be used to modify the system parameters of the lithography system on the basis of calculated correction factors.

Aspects of this disclosure are also applicable to any mode of use of a lithographic apparatus, including step mode, scan mode, other modes that use a programmable patterning device and a pulsed radiation source; or modes that comprise various combinations of these techniques.

The self-assessment of a product substrate according to this disclosure can comprise exposing a substrate in at least two different orientations, and measuring the overlay between corresponding markers formed from different exposures.

It should be appreciated that the exposure of a substrate in at least two different orientations means that the substrate is intentionally positioned at a first orientation and then rotated to a second orientation.

In one embodiment, the substrate can be exposed with a specialized reticle containing special scatterometry marks. Normally, these scatterometry marks consist of two parts (boxes or gratings). One or more first marker portions of these scatterometry markers can be exposed with one exposure, and one or more second marker portions can be exposed with a different exposure, where the substrate has a different orientation as compared to the case of the orientation during the first exposure. The two portions are designed to overlap to form a composite marker. This composite marker can then be measured, and any overlay errors between the first and second marker portions then give a representation of the system parameter errors.

The method of this embodiment may be carried out on a substrate that is already pre-etched with reference markers, and can if desired be carried out by an off-tool measurement device.

In an alternative embodiment, two similar sets of markers can be exposed with each different exposure. They are designed to be in alignment, and any overlay errors between the two markers then give a representation of the system parameter errors.

The system parameter errors that can be represented include for example scan/step direction offset, positioning and deformation errors, as well as intrafield errors.

The exposure positions are chosen such that it is possible to measure overlay between two layers that are exposed in different orientations, for example, overlay between a layer exposed in a normal wafer orientation and layer exposed when wafer is rotated on 180 degrees.

For example, if a marker is horizontally oriented and consist of regularly spaced gratings, an alignment sensor measuring this marker can determine the X position of the marker. If then we rotate this marker by 90 degrees, an alignment sensor can give Y information. If we expose one horizontal marker in 0 degree and another in 180 and readout both markers, we get two (or difference between these two) horizontal positions. Both markers will be seen during alignment as markers of one type (horizontal). On the other hand, if two markers are exposed in an arbitrary rotation, we would end up in two differently oriented structures on the wafer that will not be seen as markers on the same type.

It should be noted that for the two-part composite markers of the type mentioned above, there is a requirement that the different orientations still yield a properly formed composite marker. At least two different orientations are required, although more can be used if required, in order to provide more accurate readings of the errors being measured. The angular difference between the orientations is arbitrary although for good results an angular difference of 90 degrees would be useful. For example, measurements could be carried out for one or more of 0 vs. 90; 90 vs. 180; 180 vs. 270; or 270 vs. 360 degrees orientations.

It will be appreciated that the definition of the reference orientation of 0 degrees is also arbitrary.

Similarly to wafer grid errors, intrafield (scanning reticle stage) errors could be determined.

The overlay information is used to determine a polynomial model for different causes. Polynomial representation of a model is used to reduce noise to calibration and to make a calibration generic for arbitrary exposure positions.

This can be represented by the notation below, in which the terms "upper," "lower," "left," and "right" refer to positions of neighboring exposure areas on the wafer. The designation of these terms is essentially arbitrary. In the figures, these directions correspond to the orientation of the pages.

The following applies firstly to types of mechanisms for moving the wafer table and mask tables and for measuring their positions that use x and y interferometers, such as that shown in FIG. 8 for example.

The step dependency of the mirror deformation can be represented by:

$$dx\_0 - dx\_180 \sim \mathrm{Sum}(a\_n^*(\mathrm{sign}(\mathrm{step\_direction}\_0)^* y\_0^{\wedge} n - \mathrm{sign}(\mathrm{step\_direction}\_180)^* y\_180^{\wedge} n)).$$

In this and subsequent notation, the x and y subscripts denote the angle of orientation of the relevant exposure. That is, the difference in the measured x-position between a first exposure taken at an orientation of 0 degrees and a second exposure taken at an orientation of 180 degrees is approximately equal to $$\sum_{n=0}^{N} a_n(\mathrm{sgn}(\mathrm{step\_direction}_0) y_0^n - \mathrm{sgn}(\mathrm{step\_direction}_{180}) y_{180}^n).$$

Here, sgn is the signum function, where sgn(a)=+1 if a>0; 0 if a=0 and −1 if a<0. The step direction is the direction with respect to a wafer at the zero degree position.

Similarly, $dy\_0 - dy\_180 \sim \mathrm{Sum}\ (b\_n^*(\mathrm{sign}(\mathrm{step\_direction}\_0)^* x\_0^{\wedge} n - \mathrm{sign}(\mathrm{step\_direction}\_180)^* x\_180^{\wedge} n))$.

That is, the difference in the measured y-position between a first exposure taken at an orientation of 0 degrees and a second exposure taken at an orientation of 180 degrees is approximately equal to $$\sum_{n=0}^{N} b_n(\mathrm{sgn}(\mathrm{step\_direction}_0) x_0^n - \mathrm{sgn}(\mathrm{step\_direction}_{180}) x_{180}^n).$$

[Also, another positioning error can be described as dy~P(x)]

The scan dependency of mirror deformation can be represented by:

$$dx\_0 - dx\_180 \sim \mathrm{Sum}(c\_n^*(\mathrm{sign}(\mathrm{scan\_direction}\_0)^* y\_0^{\wedge} n - \mathrm{sign}(\mathrm{scan\_direction}\_180)^* y\_180^{\wedge} n)).$$

That is, the difference in the measured x-position between a first exposure taken at an orientation of 0 degrees and a second exposure taken at an orientation of 180 degrees is approximately equal to $$\sum_{n=0}^{N} c_n(\mathrm{sgn}(\mathrm{scan\_direction}_0) y_0^n - \mathrm{sgn}(\mathrm{scan\_direction}_{180}) y_{180}^n).$$

Similarly, $dy\_0 - dy\_180 \sim \mathrm{Sum}\ (d\_n^*(\mathrm{sign}(\mathrm{scan\_direction}\_0)^* x\_0^{\wedge} n - \mathrm{sign}(\mathrm{scan\_direction}\_180)^* x\_180^{\wedge} n))$.

That is, the difference in the measured y-position between a first exposure taken at an orientation of 0 degrees and a second exposure taken at an orientation of 180 degrees is approximately equal to $$\sum_{n=0}^{N} d_n(\mathrm{sgn}(\mathrm{scan\_direction}_0) x_0^n - \mathrm{sgn}(\mathrm{scan\_direction}_{180}) x_{180}^n).$$

The two-dimensional effect on the wafer of deformation in x and y directions can be represented by two-dimensional polynomials The step dependency of wafer deformation can be represented by:

$$dx\_0 - dx\_180 = \mathrm{Sum}(\mathrm{Sum}(e\_n\_m^*(\mathrm{sign}(\mathrm{step\_direction}\_0)^* x\_0^{\wedge} n^* y\_0^{\wedge} N - m - \mathrm{sign}(\mathrm{step\_direction}\_180)^* x\_180^{\wedge} n^* y\_180^{\wedge} N - m))).$$

That is, the difference in the measured x-position between a first exposure taken at an orientation of 0 degrees and a second exposure taken at an orientation of 180 degrees is approximately equal to $$\sum_{n=0}^{N}\sum_{m=n}^{N} e_{n,m}(sgn(\mathrm{step\_direction}_0) x_0^n y_0^{N-m} - sgn(\mathrm{step\_direction}_{180}) x_{180}^n y_{180}^{N-m})..$$

Similarly, $$dy\_0 - dy\_180 = \mathrm{Sum}(\mathrm{Sum}(f\_n\_m^*(\mathrm{sign}(\mathrm{step\_direction}\_0)^* x\_0^{\wedge} n^* y\_0^{\wedge} N - m - \mathrm{sign}(\mathrm{step\_direction}\_180)^* x\_180^{\wedge} n^* y\_180^{\wedge} N - m))).$$

That is, the difference in the measured y-position between a first exposure taken at an orientation of 0 degrees and a second exposure taken at an orientation of 180 degrees is approximately equal to $$\sum_{n=0}^{N}\sum_{m=n}^{N} f_{n,m}(sgn(\mathrm{step\_direction}_0) x_0^n y_0^{N-m} - sgn(\mathrm{step\_direction}_{180}) x_{180}^n y_{180}^{N-m})..$$

The scan dependency of wafer deformation can be represented by:

$$dx\_0 - dx\_180 = \text{Sum}(\text{Sum}(g\_n\_m*(\text{sign}(\text{scan\_direction}\_0)*x\_0^n*y\_180^m - \text{sign}(\text{scan\_direction}\_180)*x\_180^n*y\_180^m)))$$

That is, the difference in the measured x-position between a first exposure taken at an orientation of 0 degrees and a second exposure taken at an orientation of 180 degrees is approximately equal to $$\sum_{n=0}^{N}\sum_{m=n}^{N} g_{n,m}(sgn(\text{scan\_direction}_0)x_0^n y_0^{N-m} - sgn(\text{scan\_direction}_{180})x_{180}^n y_{180}^{N-m})..$$

Similarly, $$dy\_0 - dy\_180 = \text{Sum}(\text{Sum}(h\_n\_m*(\text{sign}(\text{scan\_direction}\_0)*x\_0^n*y\_0^m - \text{sign}(\text{scan\_direction}\_180)*x\_180^n*y\_180^m)))$$

That is, the difference in the measured y-position between a first exposure taken at an orientation of 0 degrees and a second exposure taken at an orientation of 180 degrees is approximately equal to:

$$\sum_{n=0}^{N}\sum_{m=n}^{N} h_{n,m}(sgn(\text{scan\_direction}_0)x_0^n y_0^{N-m} - sgn(\text{scan\_direction}_{180})x_{180}^n y_{180}^{N-m})..$$

It is also possible to apply similar aspects to the types of mechanisms for moving the wafer table and mask tables and for measuring their positions that use encoders that output (x,y) coordinates, such as that shown in FIG. 7 for example.

In that case, the step direction can be represented by:

$$(dx\_0, dy\_0) - (dx\_180, dy\_180) = \text{Encoder model}((\text{sign}(\text{step\_direction}\_0) - \text{sign}(\text{step\_direction}\_180))*h\_\text{step})$$

where h_step is a vector that characterizes encoder displacement caused by a stepping move. Here, the difference in measured (x,y) coordinates between a first exposure taken at an orientation of 0 degrees and a second exposure taken at an orientation of 180 degrees is described by the displacement of encoders as application the Encoder model to (sgn(step_direction_0)−sgn(step_direction_180))*h_step). The "Encoder model" referred to here is a positioning model, representing a transformation from measured encoder values (h) to a position (q) of a measured object in a Cartesian coordinate system (for example having six degrees of freedom, namely the offset in X, Y and Z as well as rotation and tilt of wafer stage (Rz, Rx, Ry)). The model can be described as h=A*q+C*r(q). For some applications we can assume that h=A*q, ignoring high order or cross-terms. In the present case, q=B*h, where B=A$^{-1}$. It is a simplified linear model that can be read as a transformation from h (encoder) to q (only horizontal offset in (x,y) coordinates). The error between an upper exposed field and a neighboring lower exposed field (x,y) positions is derived from the encoder model applied to the difference of errors on encoders induced by stepping direction (h$_{step}$) where h$_{step}$ is the encoder error caused by stepping in positive direction (along the X axis). The scan direction can be represented by: (dx_0,dy_0)−(dx_180, dy_180)=Encoder model((sign(scan_direction_0)−sign(scan_direction_180))*h_scan). That is, the difference in measured (x,y) coordinates between a first exposure taken at an orientation of 0 degrees and a second exposure taken at an orientation of 180 degrees is equal to the Encoder model applied to ((sign(scan_direction_0)−sign(scan_direction_180))*h_scan).

Wafer deformation can be represented by:

$$dx\_0 - dx\_180 = \text{Sum}(\text{Sum}(r\_n\_m*(x\_0^n*y0^{N-m} - x\_180^n*y\_180^{N-m})))$$

That is, the difference in the measured x-position between a first exposure taken at an orientation of 0 degrees and a second exposure taken at an orientation of 180 degrees is equal to $$\sum_{n=0}^{N}\sum_{m=n}^{N} r_{n,m}(x_0^n y_0^{N-m} - x_{180}^n y_{180}^{N-m}).$$

Similarly, $$dy\_0 - dy\_180 = \text{Sum}(\text{Sum}(s\_n\_m*(x\_0^n*y\_0^{N-m} - x\_180^n*y\_180^{N-m})))$$

That is, the difference in the measured y-position between a first exposure taken at an orientation of 0 degrees and a second exposure taken at an orientation of 180 degrees is equal to $$\sum_{n=0}^{N}\sum_{m=n}^{N} s_{n,m}(x_0^n y_0^{N-m} - x_{180}^n y_{180}^{N-m}).$$

Aspects of this disclosure can also be used to correct for mirror errors for interferometer systems. For the types of mechanisms for moving the wafer table and mask tables and for measuring their positions that use x and y interferometers, such as that shown in FIG. 8 for example, the mirror errors can be represented by: dx_0−dx_180∼Sum(t_n*(y_0−y_180^n)). That is, the difference in the measured x-position between a first exposure taken at an orientation of 0 degrees and a second exposure taken at an orientation of 180 degrees is approximately equal to $$\sum_{n=0}^{N} t_n(y_0^n - y_{180}^n).$$

Similarly, dy_0−dy_180∼Sum(u_n*(x_0^n−x_180^n)). That is, the difference in the measured y-position between a first exposure taken at an orientation of 0 degrees and a second exposure taken at an orientation of 180 degrees is approximately equal to $$\sum_{n=0}^{N} u_n(x_0^n - x_{180}^n).$$

For types of mechanisms for moving the wafer table and mask tables and for measuring their positions that use encoders that output (x,y) coordinates, such as that shown in FIG. 7 for example, the encoder errors can be represented by:

$$(dx\_0, dy\_0) - (dx\_180, dy\_180) = \text{Encoder\_model}(\text{Sum}(\text{Sum}(v\_i\_n\_m*(x\_0^n*y\_0^{N-m-x}\_180^n*y\_180^{N-m}))))$$

That is, the difference in measured (x,y) coordinates between a first exposure taken at an orientation of 0 degrees and a second exposure taken at an orientation of 180 degrees is equal to $q_0-q_{180}=Bh$ where h is a vector with each element having the following representation $$h_i = \sum_{n=0}^{N}\sum_{m=n}^{N} v_{i,n,m} x^n y^{N-m}, \quad q_0 = (dx_0, dy_0), \quad q_{180} = (dx_{180}, dy_{180})$$

and B represents encoder model.

Once the difference between errors (in all the above examples) on different wafer positions has been determined, it is possible to use the determined dy_0−dy_180 to create a linear problem for determining polynomial coefficients s that minimize the relative error. These coefficients can be used for correction during further exposure. The linear problem may take the form of:

$$\|A*s-b\| \to \min$$

where A depends on the specific polynomial appropriate for the type of error being considered (for example, in the immediately preceding case A=x_0^n*y_0^N−m−x_180^n*y_180^N−m), b is the measured difference {dy_0−dy_180} and s is a solution (polynomial coefficients). Clearly the above examples for calculation of dx_0−dx_180 and (dx_0,dy_0)−(dx_180,dy_180) can be treated in an equivalent way.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic, and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building storing blocks illustrating the implementation of specified functions and relationships thereof. The boundaries of these functional building storing blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method comprising:
    performing a plurality of exposures to form a plurality of patterns on a substrate, the substrate being positioned at a different orientation during each exposure of the plurality of exposures to form a corresponding pattern of the plurality of patterns;
    measuring an overlay error between a first pattern and a second pattern of the plurality of patterns, the first pattern being exposed at a first substrate orientation and the second pattern being exposed at a second substrate orientation, the first and second substrate orientations being different from each other; and
    determining, based on the measured overlay error, a model representative of a relationship between the overlay error and a system parameter error, wherein the model comprises a polynomial function.

2. The method of claim 1, wherein:
the measuring of the overlay error comprises measuring a composite pattern formed from overlapping of the first and second patterns.

3. The method of claim 1, wherein the substrate is a production wafer.

4. A method comprising:
performing a plurality of exposures to form a plurality of patterns on a substrate, the substrate being positioned at a different orientation during each exposure of the plurality of exposures to form a corresponding pattern of the plurality of patterns;
measuring an overlay error between a first pattern and a second pattern of the plurality of patterns, the first pattern being exposed at a first substrate orientation and the second pattern being exposed at a second substrate orientation, the first and second substrate orientations being different from each other;
determining, based on the measured overlay error, a model representative of a relationship between the overlay error and a system parameter error, wherein the model comprises a polynomial function; and
deriving a calibration correction factor from the model.

5. The method of claim 4, wherein the system parameter error comprises a scanning error.

6. A lithographic apparatus comprising:
an illuminator configured to perform a plurality of exposures to form a plurality of patterns on a substrate, the substrate being positioned at a different orientation during each exposure of the plurality of exposures to form a corresponding pattern of the plurality of patterns;
a measurement device configured to measure an overlay error between a first pattern and a second pattern of the plurality of patterns, the first pattern being exposed at a first substrate orientation and the second pattern being exposed at a second substrate orientation, the first and second substrate orientations being different from each other; and
a processing device configured to determine, based on the measured overlay error, a model representative of a relationship between the overlay error and a system parameter error, wherein the model comprises a polynomial function.

7. A lithographic apparatus comprising:
an illuminator configured to perform a plurality of exposures to form a plurality of patterns on a substrate, the substrate being positioned at a different orientation during each exposure of the plurality of exposures to form a corresponding pattern of the plurality of patterns;
a measuring device configured to measure an overlay error between a first pattern and a second pattern of the plurality of patterns, the first pattern being exposed at a first substrate orientation and the second pattern being exposed at a second substrate orientation, the first and second substrate orientations being different from each other; and
a processing device configured to:
determine, based on the measured overlay error, a model representative of a relationship between the overlay error and a system parameter error, wherein the model comprises a polynomial function; and
derive a calibration correction factor from the model.

8. A non-transitory computer-readable medium having computer program logic recorded thereon, execution of which, by a computing device, causes the computing device to perform operations comprising:
performing a plurality of exposures to form a plurality of patterns on a substrate, the substrate being positioned at a different orientation during each exposure of the plurality of exposures to form a corresponding pattern of the plurality of patterns;
measuring an overlay error between a first pattern and a second pattern of the plurality of patterns, the first pattern being exposed at a first substrate orientation and the second pattern being exposed at a second substrate orientation, the first and second substrate orientations being different from each other; and
determining, based on the measured overlay error, a model representative of a relationship between the overlay error and a system parameter error, wherein the model comprises a polynomial function.

9. A non-transitory computer-readable medium having computer program logic recorded thereon, execution of which, by a computing device, causes the computing device to perform operations comprising:
performing a plurality of exposures to form a plurality of patterns on a substrate, the substrate being positioned at a different orientation during each exposure of the plurality of exposures to form a corresponding pattern of the plurality of patterns;
measuring an overlay error between a first pattern and a second pattern of the plurality of patterns, the first pattern being exposed at a first substrate orientation and the second pattern being exposed at a second substrate orientation, the first and second substrate orientations being different from each other;
determining, based on the measured overlay error, a model representative of a relationship between the overlay error and a system parameter error, wherein the model comprises a polynomial function; and
deriving a calibration correction factor from the model.

* * * * *